United States Patent [19]

Ieki et al.

[11] Patent Number: 5,152,864
[45] Date of Patent: Oct. 6, 1992

[54] METHOD OF MANUFACTURING SURFACE ACOUSTIC WAVE DEVICE

[75] Inventors: Hideharu Ieki; Atsushi Sakurai; Koji Kimura, all of Kyoto, Japan

[73] Assignee: Murata Manufacturing Co., Ltd., Japan

[21] Appl. No.: 732,745

[22] Filed: Jul. 18, 1991

Related U.S. Application Data

[63] Continuation of Ser. No. 537,323, Jun. 13, 1990, abandoned.

[30] Foreign Application Priority Data

Jun. 13, 1989 [JP] Japan ................... 1-151047

[51] Int. Cl.$^5$ ............................. H01L 41/08
[52] U.S. Cl. .................. 156/610; 310/313 B; 310/313 R; 427/126.4; 427/100
[58] Field of Search ............... 156/600, 610; 437/185, 437/197, 198; 427/100, 126.4; 310/313 A, 313 B, 313 C, 313 D, 313 R; 333/193, 195

[56] References Cited

U.S. PATENT DOCUMENTS

| | | | |
|---|---|---|---|
| 4,511,816 | 4/1985 | Mikoshita et al. | 310/313 A |
| 4,602,228 | 7/1986 | Yamada | 310/313 D |
| 4,623,426 | 11/1986 | Peters | 437/942 |
| 4,635,009 | 1/1987 | Ebata | 310/313 D |
| 4,775,814 | 10/1988 | Yuhara et al. | 310/313 R |
| 4,868,444 | 9/1989 | Shibata et al. | 310/313 A |
| 4,906,885 | 3/1990 | Kojima et al. | 310/313 R |

OTHER PUBLICATIONS

Wolf et al., "Silicon Processing", Lattice Press, Sunset Beach, Calif., 1987, pp. 156-158.
MacDonald et al., "Development of a Two-Step E--Beam Lithography Process for Submicron SAW Device Fabrication", Optical Engineering, vol. 18, No. 1, pp. 53-58.

Primary Examiner—Robert Kunemund
Assistant Examiner—Ken Horton
Attorney, Agent, or Firm—Ostrolenk, Faber, Gerb & Soffen

[57] ABSTRACT

Interdigital transducers and reflectors are formed on a piezoelectric substrate from an aluminum film. The aluminum film is formed by electron beam deposition at a film forming rate which is controlled to be at least 20 Å per second. The aluminum film formed in this way is crystallographically oriented in a constant direction, whereby stressmigration of the aluminum film is suppressed.

18 Claims, 4 Drawing Sheets

METHOD OF MANUFACTURING SURFACE ACOUSTIC WAVE DEVICE

This is a continuation of application Ser. No. 07/537,323 filed on Jun. 13, 1990, now abandoned.

BACKGROUND OF THE INVENTION

A related copending application of interest to the present application is U.S. Ser. No. 07/508,837 filed on Apr. 12, 1990 and assigned to the same assignee.

FIELD OF THE INVENTION

The present invention relates to a method of manufacturing a surface acoustic wave device, and more particularly, it relates to a method of manufacturing a surface acoustic wave device which comprises a piezoelectric substrate and electrodes of aluminum provided on the piezoelectric substrate.

DESCRIPTION OF THE BACKGROUND ART

In recent years, surface acoustic wave devices such as a filters, resonators or the like using surface acoustic waves, which may be hereinafter referred to as SAW devices, have been widely employed.

Such a surface acoustic wave device generally comprises a piezoelectric substrate, which is provided on its surface with interdigital transducers and/or grating reflectors formed by metal strips.

The piezoelectric substrate is prepared from a single crystal material such as quartz crystal, lithium tantalate ($LiTaO_3$), lithium niobate ($LiNbO_3$) or lithium tetraborate ($Li_2B_4O_7$), or a $ZnO/Al_2O_3$ material formed by a substrate of sapphire ($Al_2O_3$) and a film of zinc oxide (ZnO) provided thereon.

The aforementioned interdigital transducers and grating reflectors are generally prepared from aluminum, which is easy to photolithograph and has a low electrode loading mass effect due to its low specific gravity, and high conductivity.

However, it has been recognized that, when a signal of a high voltage level is applied to a surface acoustic wave device such as an SAW filter or resonator, the aluminum electrodes are exposed to strong stress by the surface acoustic waves, which causes metal migration. Such migration caused by stress is called stressmigration, to be distinguished from electromigration. The stressmigration leads to an electric short, an increase in insertion loss, a reduction in the quality factor (Q) of the resonator, and the like. Such stressmigration easily occurs as the frequency is increased, and this causes a significant problem particularly in a surface acoustic wave device which is used in a high frequency range.

As to a resonator, in particular, it is necessary to increase the gain of an oscillation circuit so as to apply a signal of an excessive voltage level, in order to cause stable oscillation. In a resonator having reflectors which are provided on both sides of one or some transducers, surface waves are confined between the reflectors and standing waves are applied to the transducers and reflectors, thereby applying strong stress thereto. Thus, stressmigration is particularly easily caused in such a resonator. To avoid this problem, a conventional SAW resonators have unavoidably had to be driven at a low voltage level, in order to suppress such stressmigration to the minimum. Thus, it has been impossible to increase the C/N ratio (carrier-to-noise ratio) or to suppress SSB (Single-Side-Band) phase-noise.

As to an SAW filter, stressmigration particularly easily occurs in a transmission filter, which receives a signal of a high voltage level.

In order to prevent the aforementioned stressmigration, a small amount of Cu, Ti, Ni, Mg, Pd or the like is added to the electrode material of aluminum. However, no satisfactory effect has been attained by such a countermeasure.

SUMMARY OF THE INVENTION

The inventors have further investigated the cause of a aforementioned stressmigration. As the result, it has been recognized that an aluminum film formed through a vapor phase process such as electron beam deposition, sputtering or the like for providing electrodes is not crystallographically oriented in a constant direction but is in an amorphous polycrystalline state. Thus, stressmigration may be caused by mass transport via grain boundaries in such aluminum electrodes.

Accordingly, an object of the present invention is to provide a method of manufacturing a surface acoustic wave device comprising aluminum electrodes, which are subject to little or no stressmigration.

The present invention is directed to a method of manufacturing a surface acoustic wave device which comprises a piezoelectric substrate and electrode means provided on the piezoelectric substrate for forming a transducer, for example. The inventive method comprises a step of forming an aluminum film for serving as the electrode means by a vapor phase process under a prescribed film forming rate. In the step of forming an aluminum film, the film forming rate is so controlled as to crystallographically orient the aluminum film in constant directions.

In a preferred embodiment of the present invention, the rate for forming the aluminum film is selected to be at least 20Å per second. The step of forming an aluminum film is carried out by electron beam deposition.

Thus, according to the present invention, the crystal axes of the aluminum film can be oriented in constant directions by controlling the rate for forming the aluminum film.

It is considered that an aluminum film which is thus crystallographically oriented in a constant direction exhibits properties which are similar to those of a single crystal film. Thus, such an aluminum film is subject to little or no stressmigration. According to the present invention, therefore, it is possible to prevent an electric short as well as prevent an increase in insertion loss caused by stressmigration. When the present invention is applied to a resonator, it is possible to prevent reduction of its quality factor caused by stressmigration. Thus, the life of the inventive surface acoustic wave device can be prolonged by suppressing stressmigration.

In general, stressmigration remarkably increases with an increase in frequency. According to the present invention, however, such stressmigration can be suppressed to maintain the surface acoustic wave device with good characteristics in a high-frequency range.

According to the present invention, further, it is possible to suppress stressmigration even if a signal of a high voltage level is applied. Thus, the inventive surface acoustic wave device can be practically applied to a circuit having a high signal level. When the present invention is applied to a surface acoustic wave resonator, therefore, it is possible to apply a signal of a high voltage level with no problem, whereby the C/N ratio can be increased and SSB phase noise can be reduced. Further, it is possible to stably oscillate the resonator, which can be used in an overdriven state with an increased gain. The present invention can also be advantageously applied to a transmission filter, to which a high-voltage signal is applied.

Preferably the piezoelectric substrate is formed with a quartz crystal substrate.

A small amount of admixture such as Cu, Ti, Ni, Mg, Pd or the like may be added to the aluminum film, in order to further effectively suppress stressmigration. The content of such an admixture is preferably selected within a range of 0.1 to 10 percent by weight.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
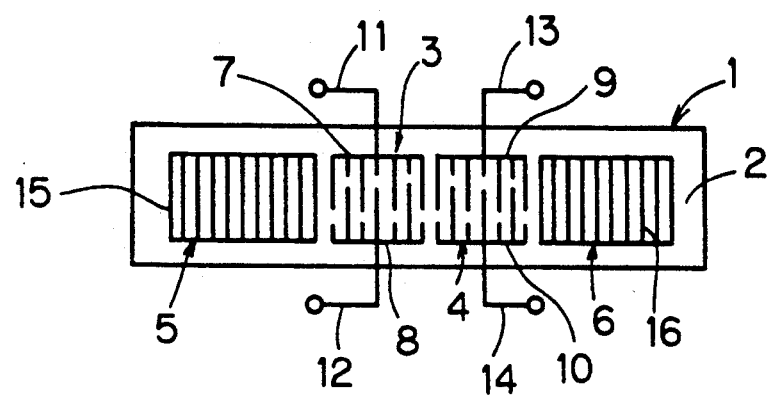
FIG. 1 is a plan view showing an exemplary surface acoustic wave device obtained by the inventive method.

Referring to FIG. 1, a surface acoustic wave device 1 comprises a piezoelectric substrate 2. The piezoelectric substrate 2 is provided on its surface with, e.g., two interdigital transducers 3 and 4 and two grating reflectors 5 and 6 which are positioned on either side of transducers 3 and 4. The interdigital transducer 3 comprises a pair of interdigital electrodes 7 and 8. Electrode fingers provided in the interdigital electrode 7 are partially opposite to those provided in the interdigital electrode 8. On the other hand, the interdigital transducer 4 comprises a pair of interdigital electrodes 9 and 10. Electrode fingers provided in the interdigital electrode 9 are partially opposite to those provided in the interdigital electrode 10. Lead terminals 11, 12, 13 and 14 are connected to the interdigital electrodes 7, 8, 9 and 10 respectively.

The reflectors 5 and 6 are formed by grating electrodes, which are provided with respective pluralities of parallel metal strips 15 and 16.

Such a surface acoustic wave device 1 is applicable to both a two-port SAW resonator and a two-port SAW filter. In order to apply the device to a one-port SAW resonator, one of the transducers 3 and 4 may be omitted. The reflectors 5 and 6 may be formed by pluralities of grooves which are provided on the piezoelectric substrate 2. When the surface acoustic wave device 1 is applied to a SAW filter, on the other hand, one of the transducers 3 and 4 serves as an input transducer, and the remaining one serves as an output transducer. In the case of the filter, the reflectors 5 and 6 may be omitted. Further, the filter may be provided with three or more transducers.

An Example of the surface acoustic wave device 1 shown in FIG. 1 will now be described in detail along with the sequence of manufacturing the same.

A piezoelectric substrate 2 was formed by a specularly polished substrate of rotated Y-cut quartz crystal having an angle of rotation of 33.5°. An aluminum film of about 1000Å in thickness was formed on the surface of this piezoelectric substrate 2 by electron beam deposition while appropriately controlling the rate of deposition and the temperature of the substrate 2.

At this time, the film forming rate (rate of deposition) was selected to be at least 20Å/sec., to obtain an aluminum oriented film. While the rate of deposition and the temperature of the substrate 2 have been generally selected at 10Å/sec. and +160° C. respectively, it has been found to be possible for the aluminum film to be crystallographically oriented in a constant direction by increasing the rate of deposition.

As the result of an experiment made by the inventors, a (311) oriented aluminum film was obtained when the rate of deposition was set at 40Å/sec. and the temperature of the substrate 2 was set at 80° C. The temperature of the substrate 2 is preferably selected within a range of +80° C. to +160°C., while the same may be out of this range.

Figure 5A:
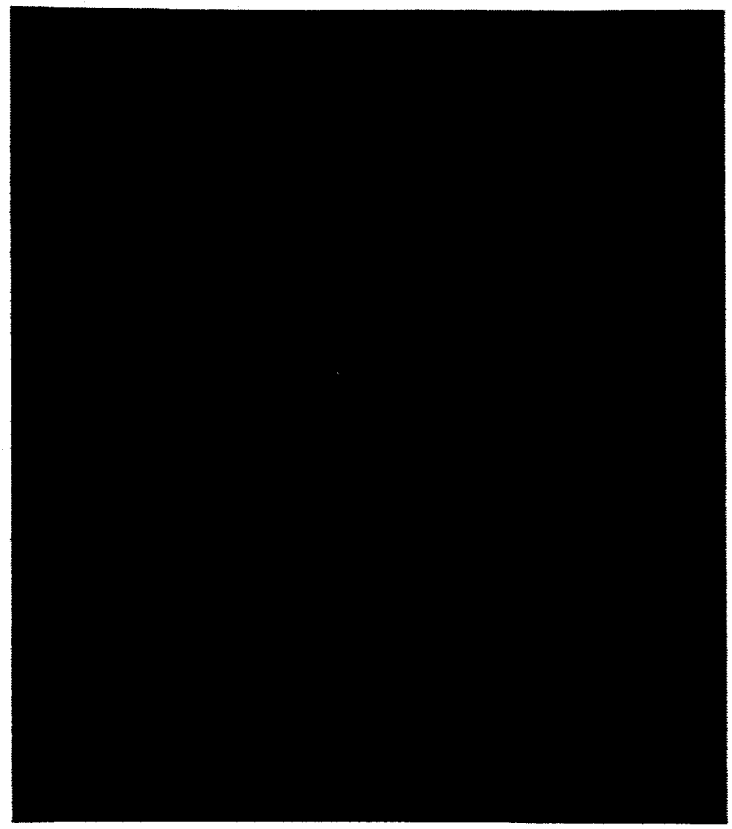
FIG. 5A is a photograph of an aluminum film according to an Example of the present invention taken through reflection high-energy electron diffraction (RHEED)

It was confirmed by reflection high-energy electron diffraction (RHEED) that the (311) plane of this aluminum film was epitaxially grown. FIG. 5A shows a photograph of the aluminum film taken through such RHEED, and FIG. 5B is an explanatory diagram for FIG. 5A.

Figure 5B:
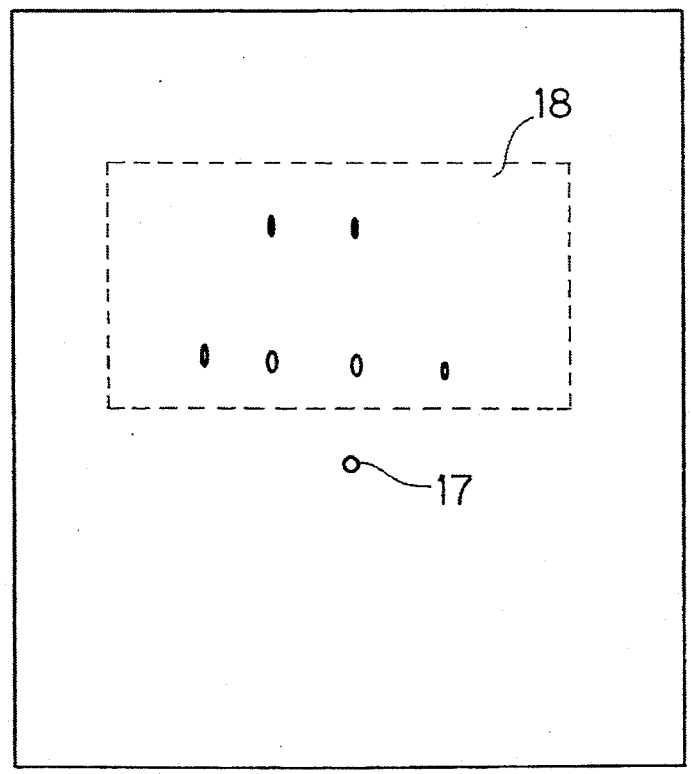
FIG. 5B is an explanatory diagram for FIG. 5A.

Referring to FIG. 5B, numeral 17 denotes a direct spot of an electron beam, and a reflected pattern is observed in a region 18. As shown in FIGS. 5A and 5B, spots appear in the reflected pattern due to periodicity of the crystal structure of the aluminum film. Thus, it can be confirmed that the aluminum film obtained in the aforementioned manner was epitaxially grown.

Figure 6A:
FIG. 6A is a photograph of an aluminum film according to a reference example taken through RHEED.

On the other hand, it has also been confirmed that an aluminum film deposited under the aforementioned conditions of the rate of deposition of 10Å/sec. and the substrate temperature of +160°C. was not epitaxially grown but was in a random-oriented (amorphous) state. FIG. 6A shows a photograph of such reference example taken through RHEED, and FIG. 6B is an explanatory diagram for FIG. 6A.

Figure 6B:
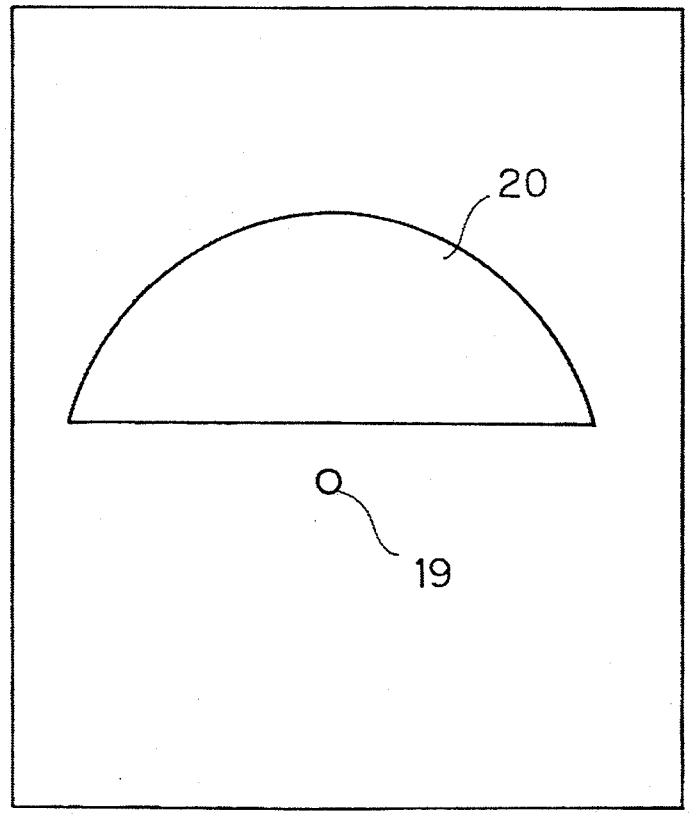
FIG. 6B is an explanatory diagram for FIG. 6A.

Referring to FIG. 6B, numeral 19 denotes a direct spot of an electron beam, and a reflected pattern is observed in a region 20. No spot appears in the reflected pattern, which is in the form of a ring or a halo. When such a ring-shaped or halo-shaped reflected pattern is obtained, the aluminum film may be evaluated as being polycrystalline or amorphous.

Both the aforementioned Example of the present invention and the reference example were worked in the following manner:

An aluminum film was worked through photolithography, to form two interdigital transducers 3 and 4 as well as reflectors 5 and 6 formed by grating electrodes on the surface of a piezoelectric substrate 2, as shown in FIG. 1.

In a surface acoustic wave device 1 thus obtained, the wavelength of surface acoustic waves was about 4.7 μm and the width of each electrode finger was about 1.17 μm, while the aperture was about 100 wavelengths. Each of the interdigital electrodes 7, 8, 9 and 10 included in the transducers 3 and 4 had 50 electrode fingers, while each of the reflectors 5 and 6 had 300 metal strips.

Figure 2:
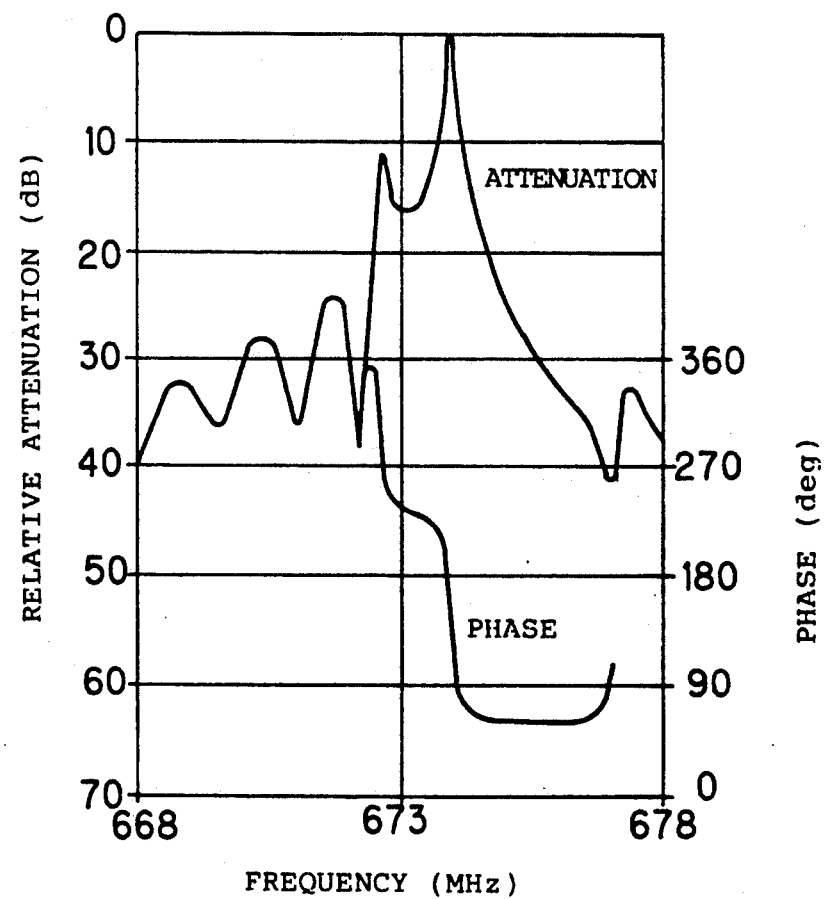
FIG. 2 illustrates the transmission response of the surface acoustic wave device shown in a FIG. 1 in 50 Ω system.

FIG. 2 shows the transmission response of a two-port SAW resonator in a 50 Ω system according to the Example obtained in the aforementioned manner. As understood from FIG. 2, the peak of attenuation appears at a frequency of about 674 MHz. Insertion loss at this peak frequency was about 6 dB. Referring to FIG. 2, the left vertical line represents relative attenuation, with insertion loss of 0 dB at the peak frequency. The characteristics of an SAW resonator prepared according to the reference example were substantially similar to those shown in FIG. 2.

Figure 3:
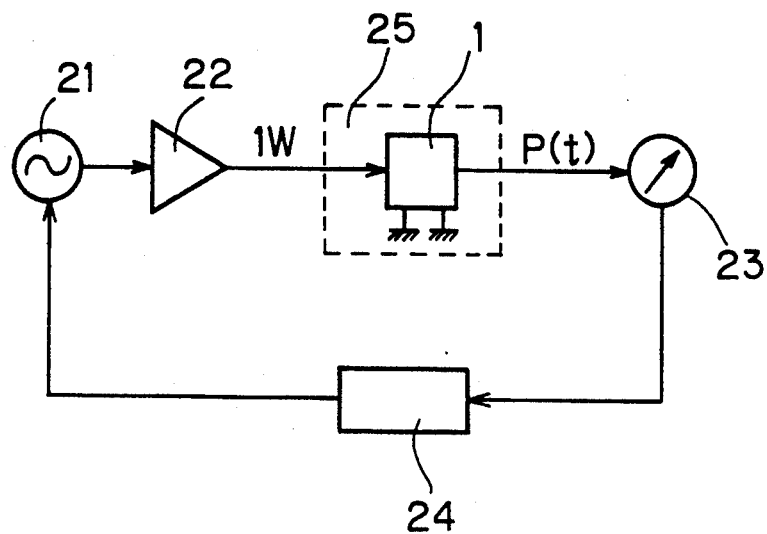
FIG. 3 is a circuit diagram of a system employed for evaluation the power resistance of surface acoustic wave devices.

FIG. 3 shows a system which was employed for evaluating power resistance, i.e., the stressmigration suppressibility of each of the Example and the reference example. The system shown in FIG. 3 is adapted to power-amplify an output of an oscillator 21 with a power amplifier 22, whose output is applied to an SAW resonator 1. An output P(t) of the SAW resonator 1 is inputted into a power meter 23, which measures the output level thereof. The output of the power meter 23 is fed back to the oscillator 21 through a computer 24, whereby the frequency of the oscillator 21 is controlled so that a signal applied to the SAW resonator 1 is regularly at the peak frequency of transmission response. The SAW resonator 1 is contained in a thermostatic oven 25, so that the SAW resonator 1 is under a high ambient temperature of 85° C., in order to provide conditions of increasing the speed for deterioration of the SAW resonator 1.

Figure 4:
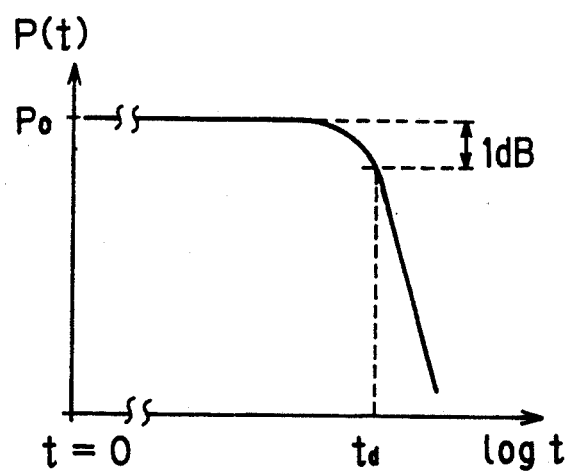
FIG. 4 illustrates a curve employed for determining the end of life caused by stressmigration.

The output of the power amplifier 22 was set at 1 W (50 Ω system) and an initial output level $P_O$ was measured and it was determined that the SAW resonator 1 reached the end of life td when $P(t) \leq P_O - 1$ (dB), where P(t) represents an output attained after a lapse of a certain time t. FIG. 4 illustrates a general curve of the output P(t). Thus, it may be proper to estimate that the resonator reaches the end of life td when the initial output $P_O$ is reduced by 1 dB.

Samples A, B and C were prepared by forming interdigital transducers 3 and 4 and reflectors 5 and 6 with aluminum films made of the following materials:

A: random-oriented pure aluminum
B: random-oriented aluminum containing 1 wt.% of Cu
C: pure aluminum epitaxially grown The samples A and B corresponded to the reference example. The sample B was prepared by adding Cu, having a migration suppressing effect, to aluminum. The sample C corresponded to the Example of the present invention.

The samples A, B and C were formed with piezoelectric substrates of quartz crystal having the same cut angles, and transducers and reflectors having the same patterns.

The lifetimes of these samples were evaluated through the system shown in FIG. 3, to attain the following results:

A: not more than 5 minutes
B: about 150 minutes
C: at least 900 minutes

The life of the sample B was longer by about 30 times than the sample A due to the effect of addition of Cu, while the life of the sample C was further longer by about 6 times than the sample B due to the effect of epitaxial growth of the aluminum film. In other words, the life of the sample C, which was prepared from pure aluminum, was longer by at least 180 times than that of the sample A, which was also prepared from pure aluminum.

Then Cu, the migration suppressing effect of which was confirmed through the sample B, was added to the sample C. A sample similar to the sample C was prepared by forming an aluminum epitaxial film containing 1 percent by weight of Cu. A text power application of 1 W proved to be improper since the life of this sample was too long. Hence, a power of 2.5 W was applied, and it was confirmed that the sample attained life of at least 8000 minutes. It is generally said that the acceleration factor due to an increase in power in stressmigration is the third or fourth power, and hence the acceleration factor in relation to applying a power of 2.5 W is $2.5^3$ or $2.5^4$, i.e., about 15 to about 39 times as compared with the case of a power application of 1 W. Thus, the life of at least 8000 minutes attained in the case of a power application of 2.5 W corresponds to a life of at least about 120,000 minutes to at least 312,000 minutes attained in the case of 1 W.

Thus, the life of the aluminum epitaxial film containing Cu was about 130 to about 340 times longer than that of the pure aluminum epitaxial film. It has been recognized that Cu may be replaced by Ti, Ni, Mg, Pd or the like, for attaining long life of the aluminum film. In general, the content of such an admixture must be at least 0.1 percent by weight in order to attain a practical effect, while this content is preferably not more than 10 percent by weight, so that the resistivity of the aluminum film is not increased.

An extremely thin film of Ti, Cr or the like may be previously formed on the piezoelectric substrate as an underlayer for the aluminum oriented film, having a thickness that will not prevent orientation of the aluminum film.

While the aluminum epitaxial film attained (311) orientation on the substrate of Y-cut quartz crystal rotating at an angle of 25° to 39°, the same may be oriented on a substrate of crystal rotating at another angle.

In general, crystal lattices of a substrate and an aluminum film must almost conform with each other to attain epitaxial growth of the aluminum film. Since crystal lattices almost conform with each other between a substrate of Y-cut crystal rotating at an angle of about 30° and the (311) plane of an aluminum film, an aluminum film is epitaxially grown on a substrate of Y-cut quartz crystal rotating at an angle of 25° to 39° in (311) plane orientation. However, the (311) plane of the aluminum epitaxial film may not necessarily be parallel to the surface of the crystal substrate. If the cut plane of the quartz crystal substrate is out of the aforementioned range of angles, the aluminum epitaxial film is so oriented that its (311) plane is inclined along the cut plane of the quartz crystal substrate. Thus, the aluminum film is oriented in correspondence to the angle of rotation of the cut crystal forming the substrate, and hence the material for the crystal substrate is not particularly restricted to rotating Y-cut quartz crystal. For example, it is possible to epitaxially grow an aluminum film on a substrate of doubly rotated cut quartz crystal so that the (311) plane of the aluminum film substantially satisfies the condition of conformity between the crystal lattices.

Although the piezoelectric substrate is formed of crystal in the above description, the same may alternatively be prepared from $LiNbO_3$, $Li_2B_4O_7$, $ZnO/Al_2O_3$ or the like. In the latter case, it is possible to form an aluminum oriented film by appropriately selecting film forming conditions and/or a film forming method such as ion beam sputtering, ion plating or the like. In this case, the aluminum epitaxial film may not be restricted to a (311) oriented film, but rather the crystal orientation of the aluminum epitaxial film is selected to satisfy the condition as to conformity of crystal lattices between the aluminum film and the substrate in any case.

Although the present invention has been described and illustrated in detail, it is clearly understood that the same is by way of illustration and example only and is not to be taken by way of limitation, the scope of the present invention being limited only by the terms of the appended claims.

What is claimed is:

1. A method of manufacturing a surface acoustic wave device resistant to stress-migration, comprising the steps of:
    preparing a piezoelectric substrate; and
    forming an aluminum film for serving as electrode mans on said piezoelectric substrate by a vapor phase process and with a controlled film forming rate,
    said step of forming an aluminum film comprising a step of controlling said film forming rate so as to crystallographically orient said aluminum film in a constant direction, thereby rendering said device resistant to stress-migration.

2. A method of manufacturing a surface acoustic wave device in accordance with claim 1, wherein said film forming rate is selected to be at least 20Å per second.

3. A method of manufacturing a surface acoustic wave device in accordance with claim 2, wherein said step of forming an aluminum film is carried out by electron beam deposition.

4. A method of manufacturing a surface acoustic wave device in accordance with claim 1, wherein said aluminum film is epitaxially grown in said step of forming an aluminum film.

5. A method of manufacturing a surface acoustic wave device in accordance with claim 1, wherein said piezoelectric substrate is made of quartz crystal.

6. A method of manufacturing a surface acoustic wave device in accordance with claim 1, wherein said aluminum film obtained in said step of forming an aluminum film contains an admixture prepared from at least one element selected from a group of Cu, Ti, Ni, Mg and Pd.

7. A method of manufacturing a surface acoustic wave device in accordance with claim 6, wherein said aluminum film contains 0.1 to 10 percent by weight of said admixture.

8. A method of manufacturing a surface acoustic wave device in accordance with claim 2, wherein said film forming rate is selected to be at least 40Å per second.

9. A method of manufacturing a surface acoustic wave device in accordance with claim 5, wherein said piezoelectric substrate is made of rotated Y-cut quartz crystal having an angle of rotation of 25° to 39°.

10. A method of manufacturing a surface acoustic wave device in accordance with claim 9, wherein said angle of rotation is about 30°.

11. A method of manufacturing a surface acoustic wave device in accordance with claim 9, wherein said angle of rotation is about 33.5°.

12. A method of manufacturing a surface acoustic wave device in accordance with claim 8, wherein said aluminum film is at least about 1000Å in thickness.

13. A method of manufacturing a surface acoustic wave device resistant to stress-migration, comprising the steps of:
    preparing a piezoelectric substrate;
    forming an aluminum film for serving as electrode means on said piezoelectric substrate by a vapor phase process and with a controlled film forming rate,
    said step of forming an aluminum film comprising a step of controlling said film forming rate so as to crystallographically orient said aluminum film in a constant direction, thereby rendering said device resistant to stress-migration; and
    forming a film of a material selected from the group consisting of Ti and Cr on the substrate as an underlayer for the aluminum film, which is sufficiently thin that it does not prevent orientation of the aluminum film.

14. A method of manufacturing a surface acoustic wave device in accordance with claim 5, wherein said piezoelectric substrate is made of doubly rotated cut quartz crystal.

15. A method of manufacturing a surface acoustic wave device in accordance with claim 1, wherein said piezoelectric substrate is made of a material selected from the group consisting of $LiNbO_3$, $Li_2B_4O_7$, and $ZnO/Al_2O_3$.

16. A method of manufacturing a surface acoustic wave device in accordance with claim 15, wherein the aluminum film is formed by ion beam sputtering.

17. A method of manufacturing a surface acoustic wave device in accordance with claim 15, wherein the aluminum film is formed by ion plating.

18. A method of manufacturing a surface acoustic wave device in accordance with claim 4, wherein the aluminum film is formed with the crystal lattice of the aluminum film substantially conforming to that of the substrate.

* * * * *